US009825256B2

United States Patent
Qi et al.

(10) Patent No.: US 9,825,256 B2
(45) Date of Patent: Nov. 21, 2017

(54) DISPLAY PANEL HAVING A TOP SURFACE OF THE CONDUCTIVE LAYER COPLANAR WITH A TOP SURFACE OF THE PIXEL DEFINE LAYER

(71) Applicant: BOE TECHNOLOGY GROUP CO., LTD., Beijing (CN)

(72) Inventors: Yonglian Qi, Beijing (CN); Shi Shu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/429,372

(22) PCT Filed: May 27, 2014

(86) PCT No.: PCT/CN2014/078533
§ 371 (c)(1),
(2) Date: Mar. 19, 2015

(87) PCT Pub. No.: WO2015/085722
PCT Pub. Date: Jun. 18, 2015

(65) Prior Publication Data
US 2016/0036005 A1  Feb. 4, 2016

(30) Foreign Application Priority Data
Dec. 12, 2013  (CN) .......................... 2013 1 0683412

(51) Int. Cl.
*H01L 51/52* (2006.01)
*H01L 27/32* (2006.01)

(52) U.S. Cl.
CPC ........ *H01L 51/5262* (2013.01); *H01L 27/322* (2013.01); *H01L 27/3246* (2013.01);
(Continued)

(58) Field of Classification Search
CPC ............. H01L 27/3246; H01L 27/3248; H01L 27/3258; H01L 51/5262; H01L 51/5206;
(Continued)

(56) References Cited

U.S. PATENT DOCUMENTS

2001/0000755 A1* 5/2001 Hirakata ........... G02F 1/136227
438/149
2004/0239238 A1* 12/2004 Lee ..................... H01L 27/3246
313/504
(Continued)

FOREIGN PATENT DOCUMENTS

CN  1413069 A  4/2003
CN  1423344 A  6/2003
(Continued)

OTHER PUBLICATIONS

Layani, M, Cooperstein, I, and Magdassi S. UV crosslinkable emulsions with silver nanoparticles for inkjet printing of conductive 3D structures. J. Mater. Chem. C, 1 (2013) 3244-3249.*
(Continued)

*Primary Examiner* — Thao X Le
*Assistant Examiner* — Gardner W Swan
(74) *Attorney, Agent, or Firm* — Nath, Goldberg & Meyer; Joshua B. Goldberg

(57) ABSTRACT

The present invention relates to the field of display technology, and particularly to a display panel and a display device comprising the display panel. The display panel comprises a substrate, which is divided into a plurality of sub-pixel areas, each of which comprises a thin film transistor and an organic light-emitting diode device provided above the thin film transistor, wherein, a pixel define layer and a conductive layer are provided above the thin film transistor and below the organic light-emitting diode device, the pixel define layer is used for defining a light-transmissive region and a
(Continued)

non-light-transmissive region of the sub-pixel area, an upper surface of the conductive layer and an upper surface of the pixel define layer are in the same plane, and the conductive layer is electrically connected to a drain of the thin film transistor.

17 Claims, 3 Drawing Sheets

(52) U.S. Cl.
CPC ...... *H01L 27/3248* (2013.01); *H01L 51/5206* (2013.01); *H01L 51/5237* (2013.01); *H01L 51/5284* (2013.01)

(58) Field of Classification Search
CPC .................. H01L 51/5284; H01L 51/5237; H01L 27/322
See application file for complete search history.

(56) References Cited

U.S. PATENT DOCUMENTS

| | | | |
|---|---|---|---|
| 2005/0212447 | A1 | 9/2005 | Oh et al. |
| 2006/0152151 | A1 | 7/2006 | Seo |
| 2006/0197458 | A1* | 9/2006 | Winters ............... G09G 3/3233 315/169.1 |
| 2009/0206421 | A1* | 8/2009 | Goh .................... H01L 27/1214 257/412 |
| 2010/0020258 | A1* | 1/2010 | Chang ................. G02F 1/13394 349/46 |
| 2011/0171445 | A1* | 7/2011 | Jung ........................ H01B 1/20 428/216 |
| 2014/0131828 | A1* | 5/2014 | Isono ................ H01L 27/14636 257/459 |
| 2015/0028292 | A1* | 1/2015 | Kang .................. H01L 27/3258 257/40 |
| 2015/0311267 | A1* | 10/2015 | Kim .................... H01L 51/0037 257/88 |

FOREIGN PATENT DOCUMENTS

| | | |
|---|---|---|
| CN | 1575074 A | 2/2005 |
| CN | 1708194 A | 12/2005 |
| CN | 1787226 A | 6/2006 |
| CN | 101149541 A | 3/2008 |
| CN | 102122665 A | 7/2011 |
| CN | 103353683 A | 10/2013 |
| CN | 103700685 A | 4/2014 |

OTHER PUBLICATIONS

Espace.net Machine Translation of CN101149541 of record (IDS), retrieved from http://translationportal.epo.org/emtp/translate/?ACTION=description-retrieval&COUNTRY=CN&ENGINE=google&FORMAT=docdb&KIND=A&LOCALE=en_EP&NUMBER=101149541&OPS=ops.epo.org/3.1&SRCLANG=zh&TRGLANG=en on Mar. 29, 2016.*

Search Report issued in International Application No. PCT/CN2014/078533 dated May 27, 2014 (May 27, 2014).

1st office action issued in Chinese application No. 201310683412.5 dated Oct. 10, 2015.

English translation of Written Opinion of PCT/CN2014/078533 from ISR dated Sep. 11, 2014 that was originally provided to the USPTO on Mar. 19, 2015 with the application.

\* cited by examiner

DISPLAY PANEL HAVING A TOP SURFACE OF THE CONDUCTIVE LAYER COPLANAR WITH A TOP SURFACE OF THE PIXEL DEFINE LAYER

FIELD OF THE INVENTION

The present invention belongs to the field of display technology, and particularly relates to a display panel and a display device comprising the display panel.

BACKGROUND OF THE INVENTION

With the development of display technology, flat-panel display devices have replaced heavy CRT display devices and become the mainstream display devices at present. Currently, common flat-panel display devices comprise LCD (Liquid Crystal Display) devices and OLED (Organic Light-Emitting Diode) display devices.

OLED, as a light-emitting device, uses a solid organic semiconductor as luminescent material, and an OLED display device is a display device using the OLED to achieve image display. Particularly, white OLED (i.e., WOLED) technology is the most mature, and WOLEDs, due to the advantages of good stability and simple fabricating process, have been widely used in display devices. In general, a WOLED display device includes an array substrate and a color filter substrate. A plurality of thin film transistors arranged in an array are included in the array substrate, and the thin film transistors serve as control components determining whether light can pass or not. The color filter layer is the key component for the WOLED display device to achieve color display. In fabricating a WOLED display device, generally, the color filter substrate and the array substrate are manufactured separately, and then are aligned and assembled. To guarantee normal operation of a display panel, the alignment and assembly of the array substrate and the color filter substrate require high precision.

With the advances in display technology, at present, a display panel having a structure in which a color filter layer is arranged on an array substrate (Color Filter on Array, and COA for short) to realize color display is used in the WOLED display device. That is, the thin film transistor array and the color filter layer are fabricated on a same substrate, and the color filter layer is provided above the thin film transistor array. FIG. 1 illustrates an example of a WOLED display device with a COA structure formed on a substrate by using a patterning process, in which a planarization protective layer is coated on the color filter layer after the color filter layer is formed, and then a WOLED device (comprising an anode, a light-emitting layer and a cathode) is formed. Specifically, on an array substrate with a thin film transistor (mainly comprising a gate 21, a gate insulation layer 22, an active layer 23, and a source 24 and a drain 25 formed in the same layer) formed thereon, a passivation (PVX) layer 3 is formed by using a patterning process (comprising steps of coating, exposing, developing, and the like), and then a black matrix 4 and a color filter layer 5 are sequentially formed on the passivation layer 3; after that, a resin layer 10 is formed on the color filter layer 5, a metal anode 11 connected to the drain 25 of the thin film transistor is formed on the resin layer 10, then a pixel define layer (PDL for short) 7 and a light-emitting layer (EL for short) 6 are further formed, finally, a metal cathode 12 is formed by sputtering, and a WOLED display device is formed after packaging. The resin layer 10 facilitates improving aperture ratio of the display device, so than an effective pixel area can be increased; meanwhile, logic power consumption is reduced, which greatly reduces power consumption of the product and improves performance of the product.

By using the above display panel with a COA structure, manufacturing of a separate color filter substrate can be omitted, and it is unnecessary to consider the precision of alignment and assembly of the array substrate and the color filter substrate; moreover, the fabricated display panel has better stability and facilitates implementing a large-sized OLED display device, and thus is commonly used in the WOLED display device to realize true color. However, such display panel has complex structure and more manufacturing processes, and requires high-precision matching between the thin film transistor array and the color filter layer, and therefore, it is difficult to achieve a high product yield. In addition, in the process of fabricating an anode by using ITO (Indium Tin Oxide), ITO is deposited on the color filter layer. As the color filter layer has a relatively large thickness, a large level difference is formed, However, ITO is generally thin, and therefore, it is difficult to deposit the ITO layer and breakage in ITO easily happens, which not only results in increased cost of a WOLED display device with such structure, but also decreases product yield.

SUMMARY OF THE INVENTION

A technical problem to be solved by the present invention is to provide a display panel with simple structure, simplified process and low cost and a display device comprising the display panel, in view of the above disadvantages existing in the prior art.

There is provided a display panel, comprising a substrate, which is divided into a plurality of sub-pixel areas, each of which comprises a thin film transistor and an organic light-emitting diode device provided above the thin film transistor, wherein, a pixel define layer and a conductive layer are provided above the thin film transistor and below the organic light-emitting diode device, the pixel define layer is used for defining a light-transmissive region and a non-light-transmissive region of the sub-pixel area, an upper surface of the conductive layer and an upper surface of the pixel define layer are in the same plane, and the conductive layer is electrically connected to a drain of the thin film transistor.

Preferably, the conductive layer has a light transmittance larger than or equal to 95%, and a surface resistance in the range of 45 Ω/sq to 90 Ω/sq.

Preferably, the conductive layer is made of a conductive resin, the conductive resin comprises resin, and conductive particles, photo-initiator, monomer, dispersant and surfactant which are uniformly distributed in the resin, and the conductive particles comprise nanoscale $SnO_2$ doped with antimony, nanoscale ITO or uniformly dispersed nano-silver solution.

Preferably, the pixel define layer is formed by using a patterning process, and the conductive layer is formed by way of ink-jetting by taking the pixel define layer as a barricade.

Preferably, in the sub-pixel area, a color filter layer is provided above the thin film transistor and below both the conductive layer and the pixel define layer, and a first via hole is formed in a part of the color filter layer corresponding to the drain of the thin film transistor so that the conductive layer is electrically connected to the drain of the thin film transistor through the first via hole.

Preferably, in the sub-pixel area, a passivation layer is provided above the thin film transistor and below the color filter layer, a second via hole is formed in a part of the passivation layer corresponding to the drain of the thin film transistor, and axes of the second via hole and the first via hole coincide with each other so that the conductive layer is electrically connected to the drain of the thin film transistor though the first via hole and the second via hole.

Preferably, a black matrix is provided above the passivation layer and below the color filter layer, and the black matrix is at least partially overlapped with a source and the drain of the thin film transistor in an orthographic projection direction, respectively.

Preferably, in the sub-pixel area, the conductive layer serves as an electrode of the organic light-emitting diode device, and the organic light-emitting diode device further comprises a light-emitting layer formed above the conductive layer and another electrode formed above the light-emitting layer.

Preferably, each of the passivation layer, the black matrix and the color filter layer is formed by a patterning process.

There is provided a display device, comprising a display panel and a driving circuit electrically connected to the display panel, wherein the display panel is the above display panel.

The beneficial effects of the present inventions are as follows. The present invention provides a display panel and a display device comprising the display panel. A conductive layer in the display panel is formed by ink-jetting, specifically, above the TFT, a pixel define layer can be formed through exposing and developing, and then the conductive layer is formed in a region defined by the pixel define layer by way of ink-jetting. The pixel define layer is not only used to define a light-transmissive region and a non-light-transmissive region of each sub-pixel area, but also serves as a barricade when forming the conductive layer by ink-jetting. In addition, the conductive layer can not only replace ITO to serve as an anode of a WOLED device, but also achieve the function of a planarization layer. Therefore, compared to the prior art, the display panel has a simpler structure; since steps of forming a planarization layer and forming a barricade separately in a display device in the prior art are omitted, and a sputtering process necessary for forming an anode by using ITO is also avoided, the process is simplified and cost is lowered.

BRIEF DESCRIPTION OF THE DRAWINGS

FIG. 3A is a cross-sectional view of forming a thin film transistor on a substrate;

FIG. 3B is a cross-sectional view of forming a pattern comprising a passivation layer on the thin film transistor;

FIG. 3C is a cross-sectional view of forming a pattern comprising a black matrix on the passivation layer;

FIG. 3D is a cross-sectional view of forming a pattern comprising a color filter layer on the black matrix;

FIG. 3E is a cross-sectional view of forming a pattern comprising a pixel define layer on the color filter layer;

FIG. 3F is a cross-sectional view of forming, by ink-jetting, a conductive layer in a region defined by the pixel define layer in FIG. 3E; and FIG. 3G is a cross-sectional view of sequentially forming a light-emitting layer and a cathode of a WOLED device on the pixel define layer and the conductive layer.

DETAILED DESCRIPTION OF THE EMBODIMENTS

To enable those skilled in the art to better understand the technical solutions of the present invention, a display panel and a display device comprising the display panel of the present invention will be further described in detail below in conjunction with the accompanying drawings and specific embodiments.

A display panel according to an embodiment of the present invention comprises a substrate, which is divided into a plurality of sub-pixel areas, each of which comprises a thin film transistor and an organic light-emitting diode device provided above the thin film transistor, wherein, a pixel define layer and a conductive layer are provided above the thin film transistor and below the organic light-emitting diode device, the pixel define layer is used for defining a light-transmissive region and a non-light-transmissive region of the sub-pixel area, an upper surface of the conductive layer and an upper surface of the pixel define layer are in the same plane, and the conductive layer is electrically connected to a drain of the thin film transistor and serves as an electrode of the organic light-emitting diode device.

A display device according to an embodiment of the present invention comprises a display panel and a driving circuit electrically connected to the display panel, wherein the display panel adopts the above display panel.

Embodiment 1

A display device provided by the embodiment is a WOLED display device. OLED devices, based on light extraction directions thereof, may be classified into bottom emission type OLED devices and top emission type OLED devices, and in the display panel of the embodiment, light of the WOLED device is extracted from bottom, that is, the WOLED device in the display device is of bottom emission type.

Figure 1:
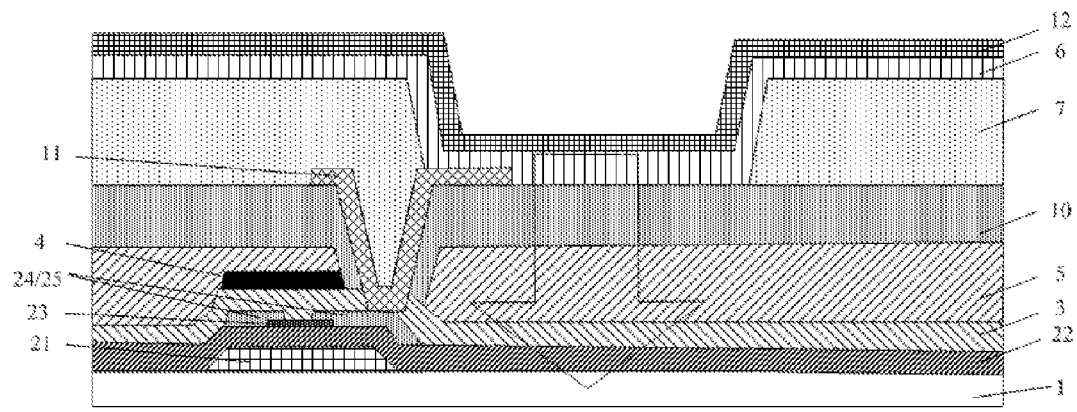
FIG. 1 is a cross-sectional view of a display panel in the prior art.
Figure 2:
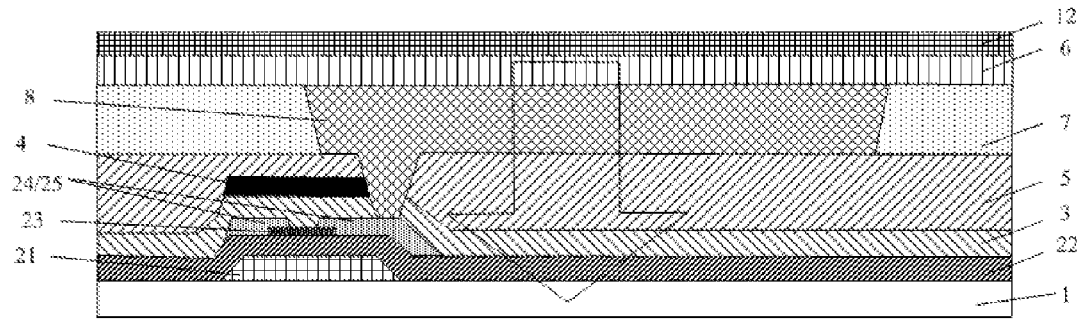
FIG. 2 is a cross-sectional view of a display panel provided by Embodiment 1 of the present invention.

In the present embodiment, the display panel of the WOLED display device comprises an array substrate and a color filter layer formed thereabove, that is, the color filter layer is provided above the array substrate, on which thin film transistors have been formed. As shown in FIG. 2, the display panel comprises a substrate 1 and a thin film transistor formed thereon, and on the thin film transistor, a passivation layer 3, a black matrix 4, a color filter layer 5 and a WOLED device are sequentially formed. The thin film transistor mainly comprises a gate 21, a gate insulation layer 22, an active layer 23, and a source 24 and a drain 25 formed in the same layer, which are sequentially formed in a stacked manner, A WOLED device at least comprises an anode 8, a light-emitting layer 6 and a cathode 12, and may optionally comprise an auxiliary function layer such as a hole injection layer, a hole transport layer, an electron blocking layer, a hole and exciton blocking layer, or the like. To distinguish a light-transmissive region of a sub-pixel area from a non-light-transmissive region thereof, a pixel define layer 7 is provided under the light-emitting layer 6 of the WOLED device.

As shown in FIG. 2, the substrate 1 is divided into a plurality of sub-pixel areas, each of which comprises a thin film transistor and a WOLED device provided thereabove, a pixel define layer 7 and a conductive layer 8 are provided above the thin film transistor and below the WOLED device, the pixel define layer 7 defines a light-transmissive region and a non-light-transmissive region for the sub-pixel area, wherein, the thin film transistor and the pixel define layer 7 are provided in the non-light-transmissive region, the conductive layer 8 is provided in the light-transmissive region, an upper surface of the conductive layer 8 and an upper surface of the pixel define layer 7 are in the same plane, and the conductive layer 8 is electrically connected to a drain 25 of the thin film transistor. In this manner, the pixel define layer 7 can not only define the light-transmissive region and the non-light-transmissive region of the sub-pixel area, but can also serve as a barricade in the subsequent process of forming the conductive layer 8 by ink-jetting. In addition, the conductive layer 8 has functions of a planarization layer and electric conduction, and can serve as an anode or cathode of the WOLED device (as the anode of the WOLED device in this embodiment).

In this embodiment, light transmittance of the conductive layer 8 is larger than or equal to 95%, so as to ensure good light transmission; a surface resistance of the conductive layer 8 ranges from 45 Ω/sq to 90 Ω/sq, so as to ensure good electrical performance. Compared to a COA mode array substrate in the prior art, in the display panel in the embodiment, a resin layer 10 is omitted, which facilitates improving aperture ratio of the display panel and increasing area of effective pixel; also, a sputtering procedure necessary for forming an anode of a WOLED device by using ITO in the prior art is avoided.

The conductive layer 8 is made of a conductive resin composite, which may be an existing material, such as a conductive resin composite, which is common in the market and is formed by uniformly mixing metal powder having good electrical conductivity such as silver with a synthetic resin having strong adhesion and serving as base material such as epoxy resin, acrylic resin or modified polyurethane. In this embodiment, preferably, the conductive resin composite comprises a resin, and conductive particles, photoinitiator, monomer, dispersant and surfactant which are uniformly distributed in the resin, and the conductive particles comprise nanoscale $SnO_2$ doped with antimony, nanoscale ITO or uniformly dispersed nano-silver solution.

In the present embodiment, to distinguish the light-transmissive region of the sub-pixel area from the non-light-transmissive region thereof, the pixel define layer 7 is formed in the non-light-transmissive region by a patterning process, and the conductive layer 8 is formed in the light-transmissive region by way of ink-jetting. Specifically, the conductive resin composite is filled into the light-transmissive region by means of ink-jetting, and the conductive layer 8 is thus formed when the conductive resin composite is cured.

Meanwhile, to realize colorization of the WOLED display device, in the sub-pixel area, a color filter layer 5 is provided above the thin film transistor and below both the conductive layer 8 and the pixel define layer 7, and a first via hole 51 (see FIG. 3D, and the first via hole 51 in FIG. 2 has been filled with the conductive resin composite) is formed in a part of the color filter layer 5 corresponding to the drain 25 of the thin film transistor, and the conductive layer 8 is electrically connected to the drain 25 of the thin film transistor through the first via hole 51. The color filter layer 5 is made of a color photoresist material, which has a light filtering function and generally has characteristics of good heat resistance, high color saturation and high light transmittance. Normally, three sub-pixel areas form one pixel area, which comprises a color filter layer 5 formed from three color photoresist materials, namely, red photoresist material, green photoresist material and blue photoresist material (one color photoresist material is provided in each sub-pixel area).

In the present embodiment, in the sub-pixel area, a passivation layer 3 is provided above the thin film transistor and below the color filter layer 5, a second via hole 31 (see FIG. 3B, the second via hole 31 in FIG. 2 has been filled with the conductive resin composite) is formed in a part of the passivation layer 3 corresponding to the drain 25 of the thin film transistor, and axes of the second via hole 31 and the first via hole 51 coincide with each other so that the conductive layer 8 is electrically connected to the drain 25 of the thin film transistor through the first via hole 51 and the second via hole 31. With the passivation layer 3, the thin film transistor can be isolated from the conductive layer 8 in an insulating manner; in the meanwhile, the thin film transistor is protected to a certain extent, so that there is no influence on the thin film transistor when forming the color filter layer 5 above the thin film transistor.

To avoid possible light leak between adjacent sub-pixel areas caused by setting gate lines or data lines, a black matrix 4 is provided on the passivation layer 3 and under the color filter layer 5, and the black matrix 4 is at least partially overlapped with the source 24 and the drain 25 of the thin film transistor in an orthographic projection direction, respectively (that is, a projection of the black matrix 4 on the substrate is at least partially overlapped with a projection of the source 24 of the thin film transistor on the substrate and a projection of the drain 25 of the thin film transistor on the substrate, respectively). The black matrix 4 also exerts a protective function on the thin film transistor.

In FIG. 2, in the sub-pixel area, the conductive layer 8 severs as one electrode (e.g., anode) of the WOLED device, a light-emitting layer 6 is provided on the conductive layer 8, the other electrode (e.g., cathode) is provided on the light-emitting layer 6, and when the WOLED device emits light, image display can be realized.

Similar to the prior art, the passivation layer 3, the black matrix 4 and the color filter layer 5 in the display panel of the present embodiment are each formed by a patterning process. A specific fabricating method of the display panel will be described in detail thereinafter.

Before describing the specific fabricating method, it should be understood that, in the present invention, a patterning process may only includes a photolithographic process, or includes a photolithographic process and an etching procedure, and meanwhile, may also include other process for forming a predetermined pattern such as printing, ink-jetting or the like; the photolithographic process refers to a process including film forming, exposing, developing and other processes and using a photoresist, a mask, an exposure machine and the like to form an image. A corresponding patterning process can be selected based on the structure formed in the present invention.

As shown in FIGS. 3A to 3G, a fabricating method of the above display panel specifically comprises the following steps S1 to S7.

At step S1, a thin film transistor is formed on a substrate.

Figure 3A:
FIGS. 3A to 3G are schematic diagrams illustrating forming process of the display panel in FIG. 2, in FIGS. 3A to 3G.

In this step, a plurality of sub-pixel areas are arranged on the substrate, a thin film transistor is formed in each sub-pixel area. As shown in FIG. 3A, on the substrate 1, the thin film transistor 2 comprises a gate 21, a gate insulation layer 22, an active layer 23, and a source 24 and a drain 25 provided in the same layer, which are sequentially formed in a stacked manner.

Since the specific structure of the thin film transistor can be flexibly designed as required, and the processes for forming the respective layers thereof may adopt those in the prior art, these processes are not elaborated herein. After this step is completed, the commonly called array backboard is achieved.

At step S2, a pattern comprising a passivation layer is formed on the thin film transistor.

Figure 3B:
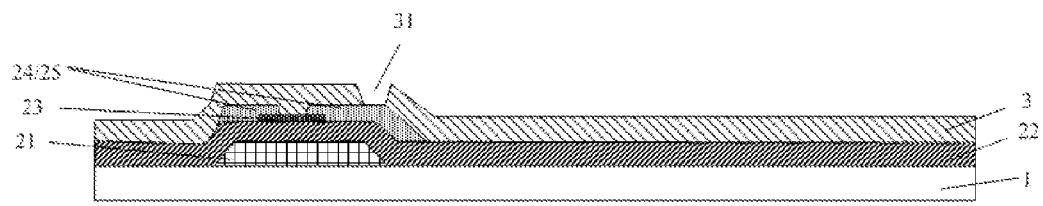

In this step, the passivation layer 3 is a protective layer, and is formed by using a patterning process. As shown in FIG. 3B, a passivation layer film is formed on the thin film transistor, a pattern comprising the passivation layer 3 and a second via hole 31 is formed through exposing, developing and dry etching processes, and then postbaking is performed on the display panel.

At step S3, a pattern comprising a black matrix is formed on the passivation layer.

Figure 3C:
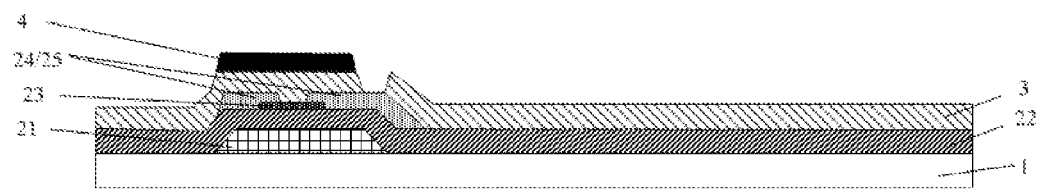

As shown in FIG. 3C, in this step, a black matrix 4 is formed on the passivation layer 3, and the black matrix 4 is at least partially overlapped with the source 24 and the drain 25 of the thin film transistor in an orthographic projection direction, respectively. Similar to the fabricating process of the passivation layer 3, the black matrix 4 is formed by using a patterning process. Specifically, the black matrix is formed on a part of the passivation layer 3 corresponding to the active layer 23 of the thin film transistor, and a pattern comprising the black matrix 4 is formed through exposing and developing. The black matrix 4 can effectively prevent light leak, and can also exert a good protective function on the thin film transistor.

At step S4, a pattern comprising a color filter layer is formed above the black matrix.

Figure 3D:
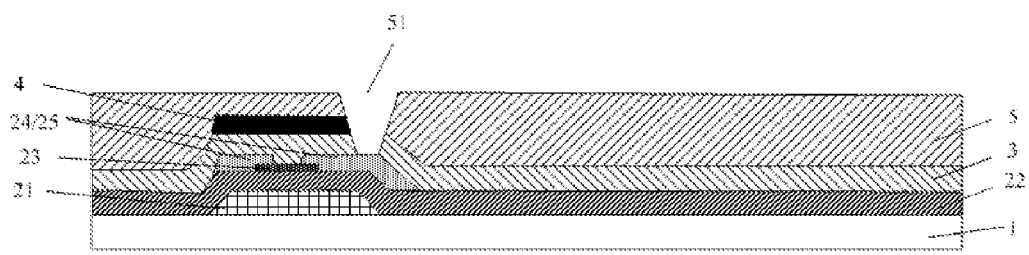

As shown in FIG. 3D, in this step, color photoresist materials of three colors, namely, red (R) photoresist materials, green (G) photoresist materials and blue (B) photoresist materials are formed in the respective sub-pixel areas in a certain sequence, respectively. Similarly, by using a patterning process, a pattern comprising the color filter layer 5 and a first via hole 51 is formed through exposing and developing. Axes of the second via hole 31 and the first via hole 51 coincide with each other so that the conductive layer 8, which is formed later, is electrically connected to the drain 25 of the thin film transistor through the second via hole 31 and the first via hole 51.

At step S5, a pattern comprising a pixel define layer is formed above the color filter layer.

Figure 3E:
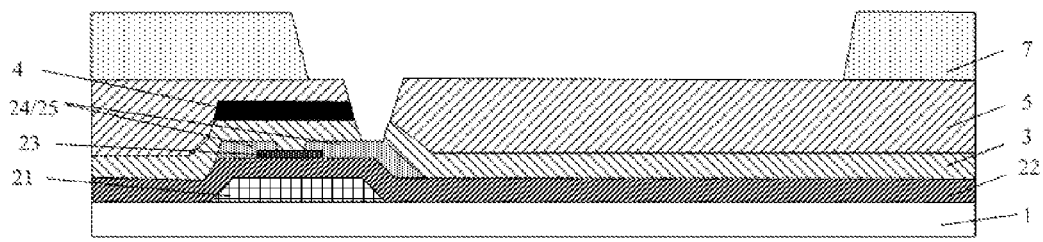

In this embodiment, the sub-pixel area comprises a light-transmissive region and a non-light-transmissive region, and the thin film transistor is provided in the non-light-transmissive region. As shown in FIG. 3E, in this step, the pixel define layer 7 is provided in the non-light-transmissive region. Similarly, by using a patterning process, a pattern comprising the pixel define layer (PDL for short) is formed in a non-light-emitting region (i.e., non-light-transmissive region) through exposing and developing, and thus the light-transmissive region and the non-light-transmissive region are divided.

The pixel define layer 7 formed in this step also serves as a barricade when forming a conductive layer by ink-jetting in the subsequent fabricating process, and therefore, compared to the prior art (in which a barricade needs to be separately formed by a patterning process), the fabricating method of the display panel in this embodiment also omits a step of forming the barricade separately.

Here, it should be understood that, FIG. 3E only illustrates one example of the pattern of the pixel define layer, according to different applications of the display device and different demands for product, the pattern of the pixel define layer can be flexibly designed based on actual conditions, and the specific shape is not limited in the present invention.

At step S6, a conductive layer is formed in an area defined by the pixel define layer.

Figure 3F:
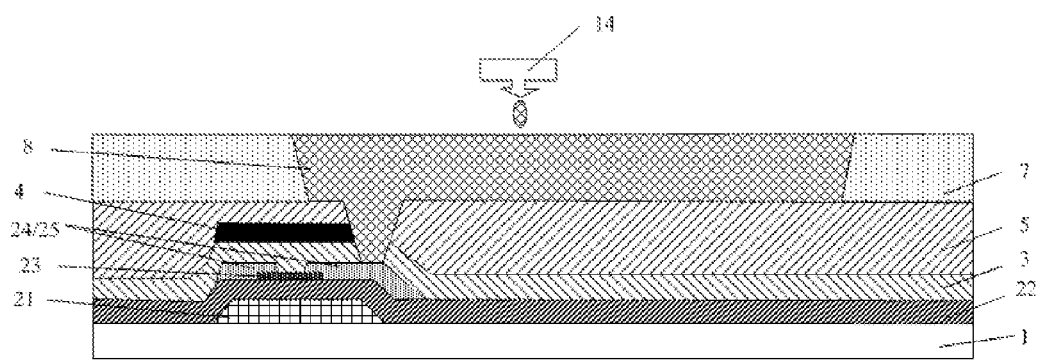

As shown in FIG. 3F, in this step, conductive resin composite is filled in an area defined by the pixel define layer 7 by way of ink-jetting, so as to form the conductive layer 8. An upper surface of the conductive layer 8 and an upper surface of the pixel define layer 7 are in the same plane, and the conductive layer 8 is electrically connected to the drain 25 of the thin film transistor through the second via hole 31 and the first via hole 51.

By directly forming the conductive layer 8 in the area defined by the pixel define layer 7 by ink-jetting, and making the upper surfaces of the conductive layer 8 and the pixel define layer 7 in the same plane, that is, planarizing the upper surfaces of the conductive layer 8 and the pixel define layer 7, a function of a planarization protective layer in the prior art is achieved. Meanwhile, the conductive layer 8, due to its electric conductivity, can also serve as an electrode of the WOLED device (as the anode of the WOLED device in this embodiment), and thus a step of forming ITO film through sputtering so as to form an anode of a WOLED device in the prior art is omitted.

Specifically, as shown in FIG. 3F, a nozzle 14 is aimed at an area defined by the pixel define layer 7, the conductive resin composite is dropped in the area (i.e., ink dropping), and the conductive layer 8 is formed after a curing step. In the present embodiment, preferably, the conductive resin composite comprises a resin, and conductive particles, photo-initiator, monomer, dispersant and surfactant which are uniformly distributed in the resin, and the conductive particles comprise nanoscale $SnO_2$ doped with antimony, nanoscale ITO (Indium Tin Oxide), uniformly dispersed nano-silver solution or the like. According to different conductive resin composites, different nozzles 14 (including thermal-bubble type nozzles and piezoelectric nozzles) may be adopted. By forming the conductive layer by ink-jetting, advantages of low cost, simple process, high utilization of conductive resin composite and the like can be achieved.

A preparing method of the preferred conductive resin composite in the present embodiment includes: adding conductive particles such as nanoscale $SnO_2$ doped with antimony, nanoscale ITO, uniformly dispersed nano-silver solution or the like in the resin, and mixing the conductive particles with resin, photo-initiator, monomer, dispersant, surfactant and the like uniformly, so as to form the conductive resin composite. By adjusting factors such as curing temperature, particle size of nanoparticles, light irradiation and the like, a proper conductivity of the conductive resin composite can be achieved without affecting photosensitivity, curability and other properties thereof. The resin is mainly used for adhering and keeping the form of film; the photo-initiator is mainly used for reacting when light irradiates, so as to cause a crosslinking agent to be cross-linked and undergo polymerization; the dispersant is used for dispersing respective particle components in the conductive resin composite so that the particle components are uniformly distributed; the surfactant is mainly used for keeping surface properties, such as surface tension, of photoresist.

To ensure good light transmission of the display panel and good electrical conductivity of the WOLED device, a preferred conductive resin composite is generally required to have the following characteristics: light transmittance: no less than 95%; surface resistance: 45 Ω/sq to 90 Ω/sq; uniformity of flatness: no more than 3%; hardness/adhesion/ chemical resistance/gas output: good, having no effect on performances of the thin film transistor and a light-emitting layer of the WOLED device.

At step S7, a light-emitting layer and a cathode of the WOLED device are sequentially formed on the pixel define layer and the conductive layer.

Figure 3G:
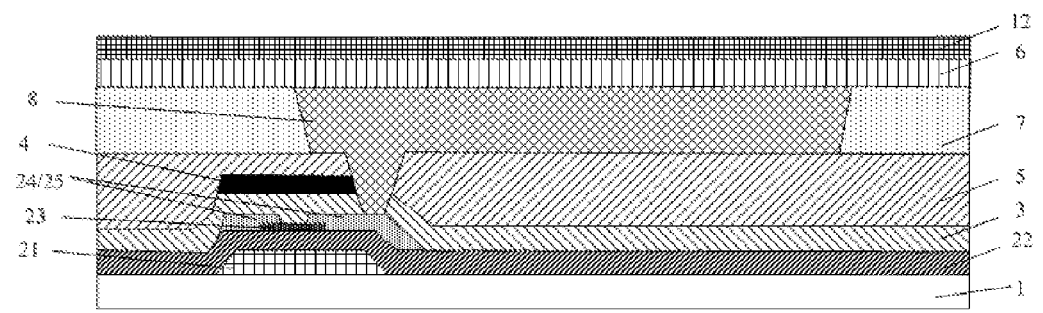

As shown in FIG. 3G, in this step, on the pixel define layer 7 and the conductive layer 8, a white light-emitting layer (EL for short) 6 is formed by evaporation, then a thin aluminum (Al) metal layer, as the cathode 12 of the WOLED device, is formed by sputtering, and packaging is performed.

Compared to the prior art, in the present embodiment, after forming the passivation layer by using a COA structure, the pixel define layer is directly used as a barricade, the conductive layer is formed by way of ink-jetting and meanwhile functions as a planarization layer, and compared to the prior art in which a planarization protective layer must be adopted to increase flatness of the upper surface of the color filter layer, one patterning process can be omitted. Since the conductive layer is formed in the area defined by the pixel define layer by ink-jetting, a patterning process for forming a barricade separately can be omitted; also, a step of forming an anode of the WOLED device by sputtering ITO can be omitted, and accordingly, problems of occurrence of breakage, shedding and the like due to difficulty in depositing ITO are avoided, which helps to ensure product yield. Therefore, the display panel formed in the present embodiment has simpler process and lower cost.

In the present embodiment, the description is given by taking a WOLED device as an example, but it can be understood that the present invention is also applicable to other OLED device.

The present embodiment further provides a display device adopting the above display panel, and the display device also comprises a driving circuit electrically connected to the display panel. Since the display device adopts the above display panel, it has advantages of low cost, stable performance and high yield.

The display device may be any product or component with display function, such as an electronic paper, a cell phone, a tablet computer, a TV, a display, a notebook computer, a digital photo frame, a navigator or the like.

Embodiment 2

This embodiment differs from Embodiment 1 in that, a WOLED device in this embodiment is of top emission type. That is, in the display panel of the embodiment, light of the WOLED device is extracted from the top. In this case, a color filter layer is accordingly provided on a light-emitting layer of the WOLED device.

Specifically, after a thin film transistor is formed, a pixel define layer (PDL for short) is firstly formed above the thin film transistor, then a metal anode (conductive layer) connected to the drain of the thin film transistor is further fabricated and a light-emitting layer (EL for short) is formed by evaporation, a color filter layer is fabricated above the EL, finally a metal cathode is formed by sputtering, and packaging is performed to form the WOLED display device.

In the present embodiment, the cathode is made of a thin aluminum metal material, so as to ensure good light transmission and satisfy demands on light extraction of a top emission type WOLED device.

The other structures of the display panel in the embodiment are the same as those of the display panel in Embodiment 1, and a fabricating method of the display panel may also refer to the fabricating method of the display panel in Embodiment 1, which are not repeated herein.

The present embodiment further provides a display device adopting the above display panel. The display device also comprises a driving circuit electrically connected to the display panel, and has advantages of low cost, stable performance and high yield.

Embodiments 1 and 2 each provide a display panel and a display device comprising the display panel. In the display panel, a COA structure is adopted and the conductive layer is formed by ink-jetting. Specifically, a pixel define layer can be directly formed through exposing and developing above the color filter layer or the thin film transistor, and then the conductive layer is formed in a region defined by the pixel define layer by way of ink-jetting. The pixel define layer is not only used to define a light-transmissive region and a non-light-transmissive region of each sub-pixel area, but also serves as a barricade when forming the conductive layer by ink-jetting. In addition, the conductive layer can not only replace ITO to serve as an anode of a WOLED device, but also achieve the function of a planarization layer. Compared to the prior art, in the present invention, the display panel has a simpler structure, correspondingly, steps of forming a planarization layer and forming a barricade separately in a display device in the prior art are omitted, a sputtering process necessary for forming an anode by using ITO is also avoided, and thus, the process is simplified and cost is lowered.

The structure of the display panel provided by the present invention is applicable to display devices adopting a bottom emission type WOLED device and a top emission type WOLED device.

It can be understood that, the forgoing implementations are merely exemplary implementations used for describing the principle of the present invention, but the present invention is not limited thereto. For a person skilled in the art, various variations and improvements can be made without departing from the spirit and essence of the present invention, and these variations and improvements are also deemed as falling within the protection scope of the present invention.

The invention claimed is:

1. A display panel, comprising a substrate, which is divided into a plurality of sub-pixel areas, each of which comprises a thin film transistor and an organic light-emitting diode device provided above the thin film transistor, wherein, a pixel define layer and a conductive layer are provided above the thin film transistor and below the organic light-emitting diode device, the pixel define layer is used for defining a light-transmissive region and a non-light-transmissive region of the sub-pixel area, an upper surface of the conductive layer and an upper surface of the pixel define layer are in a same plane, and the conductive layer is electrically connected to a drain of the thin film transistor; and a color filter layer is provided above the thin film transistor and below both the conductive layer and the pixel define layer, and a first via hole is formed in a part of the color filter layer corresponding to the drain of the thin film transistor so that the conductive layer is electrically connected to the drain of the thin film transistor through the first via hole, the pixel define layer and the conductive layer are provided directly on the color filter layer and have substantially a same thickness throughout a cross section of the color filter layer, and the conductive layer is made of a conductive resin.

2. The display panel according to claim 1, wherein the conductive layer has a light transmittance larger than or equal to 95% and a surface resistance in the range of 45 Ω/sq to 90 Ω/sq.

3. The display panel according to claim 2, wherein the conductive resin comprises resin, and conductive particles, photo-initiator, monomer, dispersant and surfactant which are uniformly distributed in the resin, and the conductive particles comprise nanoscale $SnO_2$ doped with antimony, nanoscale ITO or uniformly dispersed nano-silver solution.

4. The display panel according to claim 3, wherein the pixel define layer is formed by using a patterning process, and the conductive layer is formed by way of ink-jetting by taking the pixel define layer as a barricade.

5. The display panel according to claim 1, wherein, in the sub-pixel area, a passivation layer is provided above the thin film transistor and below the color filter layer, a second via hole is formed in a part of the passivation layer corresponding to the drain of the thin film transistor, and axes of the second via hole and the first via hole coincide with each other so that the conductive layer is electrically connected to the drain of the thin film transistor through the first via hole and the second via hole.

6. The display panel according to claim 5, wherein, a black matrix is provided above the passivation layer and below the color filter layer, and the black matrix is at least partially overlapped with a source and the drain of the thin film transistor in an orthographic projection direction, respectively.

7. The display panel according to claim 1, wherein, in the sub-pixel area, the conductive layer serves as an electrode of the organic light-emitting diode device, and the organic light-emitting diode device further comprises a light-emitting layer formed above the conductive layer and another electrode formed above the light-emitting layer.

8. The display panel according to claim 6, wherein, in the sub-pixel area, the conductive layer serves as an electrode of the organic light-emitting diode device, and the organic light-emitting diode device further comprises a light-emitting layer formed above the conductive layer and another electrode formed above the light-emitting layer.

9. The display panel according to claim 8, wherein, each of the passivation layer, the black matrix and the color filter layer is formed by a patterning process.

10. A display device, comprising a display panel and a driving circuit electrically connected to the display panel, wherein, the display panel comprises a substrate, which is divided into a plurality of sub-pixel areas, each of which comprises a thin film transistor and an organic light-emitting diode device provided above the thin film transistor, wherein, a pixel define layer and a conductive layer are provided above the thin film transistor and below the organic light-emitting diode device, the pixel define layer is used for defining a light-transmissive region and a non-light-transmissive region of the sub-pixel area, an upper surface of the conductive layer and an upper surface of the pixel define layer are in a same plane, and the conductive layer is electrically connected to a drain of the thin film transistor; and a color filter layer is provided above the thin film transistor and below both the conductive layer and the pixel define layer, and a first via hole is formed in a part of the color filter layer corresponding to the drain of the thin film transistor so that the conductive layer is electrically connected to the drain of the thin film transistor through the first via hole, the pixel define layer and the conductive layer are provided directly on the color filter layer and have substantially a same thickness throughout a cross section of the color filter layer, and the conductive layer is made of a conductive resin.

11. The display device according to claim 10, wherein the conductive layer has a light transmittance larger than or equal to 95% and a surface resistance in the range of 45 Ω/sq to 90 Ω/sq.

12. The display device according to claim 11, wherein the conductive resin comprises resin, and conductive particles, photo-initiator, monomer, dispersant and surfactant which are uniformly distributed in the resin, and the conductive particles comprise nanoscale $SnO_2$ doped with antimony, nanoscale ITO or uniformly dispersed nano-silver solution.

13. The display device according to claim 12, wherein the pixel define layer is formed by using a patterning process, and the conductive layer is formed by way of ink-jetting by taking the pixel define layer as a barricade.

14. The display device according to claim 10, wherein, in the sub-pixel area, a passivation layer is provided above the thin film transistor and below the color filter layer, a second via hole is formed in a part of the passivation layer corresponding to the drain of the thin film transistor, and axes of the second via hole and the first via hole coincide with each other so that the conductive layer is electrically connected to the drain of the thin film transistor through the first via hole and the second via hole.

15. The display device according to claim 14, wherein, a black matrix is provided above the passivation layer and below the color filter layer, and the black matrix is at least partially overlapped with a source and the drain of the thin film transistor in an orthographic projection direction, respectively.

16. The display device according to claim 10, wherein, in the sub-pixel area, the conductive layer serves as an electrode of the organic light-emitting diode device, and the organic light-emitting diode device further comprises a light-emitting layer formed above the conductive layer and another electrode formed above the light-emitting layer.

17. The display device according to claim 15, wherein, each of the passivation layer, the black matrix and the color filter layer is formed by a patterning process.

* * * * *